(12) United States Patent
Shimizu et al.

(10) Patent No.: US 9,535,136 B2
(45) Date of Patent: Jan. 3, 2017

(54) MAGNETIC FIELD PROBE

(71) Applicant: MURATA MANUFACTURING CO., LTD., Kyoto-fu (JP)

(72) Inventors: Noriko Shimizu, Kyoto-fu (JP); Takashi Ichimura, Kyoto-fu (JP); Takahiro Azuma, Kyoto-fu (JP)

(73) Assignee: Murata Manufacturing Co., Ltd., Kyoto-Fu (JP)

( * ) Notice: Subject to any disclaimer, the term of this patent is extended or adjusted under 35 U.S.C. 154(b) by 267 days.

(21) Appl. No.: 14/498,783

(22) Filed: Sep. 26, 2014

(65) Prior Publication Data

US 2015/0022195 A1  Jan. 22, 2015

Related U.S. Application Data

(63) Continuation of application No. PCT/JP2013/054867, filed on Feb. 26, 2013.

(30) Foreign Application Priority Data

Mar. 29, 2012 (JP) ................................. 2012-077079

(51) Int. Cl.
  *G01R 33/02* (2006.01)
  *G01R 33/00* (2006.01)
  *G01R 29/08* (2006.01)

(52) U.S. Cl.
  CPC ....... *G01R 33/0206* (2013.01); *G01R 33/0023* (2013.01); *G01R 33/0047* (2013.01); *G01R 29/0878* (2013.01)

(58) Field of Classification Search
  CPC ............ G01R 33/0206; G01R 33/0047; G01R 33/0023; G01R 29/0878
  (Continued)

(56) References Cited

U.S. PATENT DOCUMENTS

| | | | |
|---|---|---|---|
| 8,575,926 B2* | 11/2013 | Chao ................. | G01R 33/0283 324/244 |
| 2007/0177414 A1* | 8/2007 | Funato ............... | G01R 29/0871 365/36 |
| 2009/0322326 A1* | 12/2009 | Ito ....................... | G01R 15/181 324/263 |

FOREIGN PATENT DOCUMENTS

| | | |
|---|---|---|
| CN | 101657938 | 2/2010 |
| GB | 2461443 A | 1/2010 |
| (Continued) | | |

OTHER PUBLICATIONS

International Search Report; PCT/JP2013/054867; Jun. 4, 2013.
Written Opinion of the International Search Report; PCT/JP2013/054867; Jun. 4, 2013.

*Primary Examiner* — Billy Lactaoen
(74) *Attorney, Agent, or Firm* — Studebaker & Brackett PC

(57) ABSTRACT

A detector of a magnetic field probe includes a first wiring pattern formed on a first surface of a multilayer substrate and having a predetermined inclination with respect to an axial line direction of the magnetic field probe, a second wiring pattern formed on a second surface and having the predetermined inclination with respect to the axial line direction, and a first penetrating via penetrating through the multilayer substrate in the thickness direction and connecting a front end portion of the first wiring pattern and a front end portion of the second wiring pattern. A rear end portion of the first wiring pattern is connected to a conductor pattern configuring a strip line and a rear end portion of the second wiring pattern is connected to ground patterns configuring the strip line.

5 Claims, 13 Drawing Sheets

(58) Field of Classification Search
USPC .......................................................... 324/244
See application file for complete search history.

(56) References Cited

FOREIGN PATENT DOCUMENTS

| JP | 2000-346886 A | | 12/2000 |
|----|---------------|---|---------|
| JP | 2002-156430 A | | 5/2002 |
| JP | 2002156430 A | * | 5/2002 |
| JP | 2002-328142 A | | 11/2002 |
| JP | 2010-266233 A | | 11/2010 |
| JP | 2011-024168 A | | 2/2011 |
| JP | 2011-169793 A | | 9/2011 |

* cited by examiner

MAGNETIC FIELD PROBE

CROSS REFERENCE TO RELATED APPLICATIONS

This application claims benefit of priority to Japanese Patent Application No. 2012-077079 filed Mar. 29, 2012, and to International Patent Application PCT/JP2013/054867 filed on Feb. 26, 2013, the entire content of each of which is incorporated herein by reference.

TECHNICAL FIELD

The present technical field relates to a magnetic field probe, and in particular, relates to a magnetic field probe capable of measuring a three-dimensional magnetic field.

BACKGROUND

In a circuit substrate and the like on which an electronic component is mounted, unnecessary radiation (noise) that is emitted from the circuit substrate and the like is required to be reduced. As a device for measuring the unnecessary radiation (noise) that is emitted from the circuit substrate and the like, Japanese Unexamined Patent Application Publication No. 2000-346886 discloses an electromagnetic interference (EMI) measuring device capable of measuring strength of a magnetic field in the three-dimensional direction at a measured point. In the EMI measuring device as described in Japanese Unexamined Patent Application Publication No. 2000-346886, an inclined loop antenna including a ring-like loop part formed on a front end portion, which has a predetermined inclination (54.78°) with respect to the scanning direction, is used as a magnetic field probe.

The EMI measuring device uses the inclined loop antenna having the predetermined inclination so as to measure magnetic fields in the three axial (X-axis, Y-axis, and Z-axis) directions orthogonal to one another. A magnetic field (magnetic flux) intersecting with the loop part of the inclined loop antenna is distributed to the X-axis, Y-axis, and Z-axis uniformly. Therefore, the EMI measuring device can acquire a three-dimensional magnetic field by measuring the magnetic fields while being rotated by 120 degrees each time and combining the results thereof.

SUMMARY

Technical Problem

As described above, the EMI measuring device as described in Japanese Unexamined Patent Application Publication No. 2000-346886 uses the inclined loop antenna having the inclination of 54.78° as the magnetic field probe so as to measure the strength of the three-dimensional magnetic field.

The inclined loop antenna having the ring-like front end portion is normally produced by using a semi-rigid cable or the like. However, when the ring-like loop part having the predetermined inclination is produced by using the semi-rigid cable, for example, it is difficult to make the angle of the loop part with high accuracy at the time of the production. In addition, when the semi-rigid cable or the like is used, it is difficult to increase the number of loop turns while maintaining the predetermined inclination. In other words, there is difficulty in enhancing the sensitivity of the magnetic field probe by increasing the number of loop turns. Further, the inclined loop antenna created by using the semi-rigid cable or the like is easy to be deformed due to external force (contact with a measurement target object, for example). For this reason, it is difficult to maintain the accuracy of the inclination of the loop part for a long period of time.

The present disclosure has been made in order to solve the above-mentioned problems and an object thereof is to provide a magnetic field probe capable of forming inclination of a loop part with high accuracy at the time of production, increasing the number of loop turns while maintaining accuracy of the inclination of the loop part, and maintaining the accuracy of the inclination of the loop part for a long period of time.

Solution to Problem

An aspect of the present disclosure provides a magnetic field probe including a wiring substrate, a detector formed on a front end portion of the wiring substrate, and a transmission line having a conductor pattern and a ground pattern and connecting the detector and a base end portion of the wiring substrate. The detector includes a first line wiring pattern formed on a first surface of the wiring substrate and having a predetermined inclination with respect to an axial direction of the magnetic field probe, a second line wiring pattern formed on a second surface of the wiring substrate, which opposes the first surface, and having the predetermined inclination with respect to the axial direction of the magnetic field probe, and a first via penetrating through the wiring substrate in a thickness direction and connecting a front end portion of the first wiring pattern and a front end portion of the second wiring pattern. A rear end portion of the first wiring pattern is connected to the conductor pattern configuring the transmission line, and a rear end portion of the second wiring pattern is connected to the ground pattern configuring the transmission line.

With the magnetic field probe according to this aspect of the disclosure, a loop is formed by the first wiring pattern, the second wiring pattern, and the first via connecting the front end portion of the first wiring pattern and the front end portion of the second wiring pattern that are formed on the wiring substrate. This can form the inclination of the loop part with high accuracy at the time of production. The loop part is formed on the wiring substrate, so that the loop part is difficult to be deformed so as to maintain accuracy of the inclination of the loop part for a long period of time. In addition, the number of loop turns can be increased while maintaining the accuracy of the inclination of the loop part by increasing the number of wiring patterns, the vias, and the like that are to be formed.

In the magnetic field probe according to this aspect of the disclosure, it is preferable that the wiring substrate be a multilayer substrate including a plurality of insulator layers, the ground patterns be formed on the first surface and the second surface, respectively, so as to form a pair, the conductor pattern be formed on a third surface defined by the plurality of insulator layers between the first surface and the second surface, and the rear end portion of the first wiring pattern and the conductor pattern be connected by a via extending in the thickness direction of the multilayer substrate.

In this case, an opening of the loop part of the magnetic field probe is narrowed, and the detector (loop part) and the base end portion of the multilayer substrate are connected by the transmission line having an adjusted characteristic impedance, for example. This can match impedances of the detector, the transmission line, and the base end portion, thereby suppressing generation of reflection waves on the detector and the base end portion.

Another aspect of the present disclosure provides a magnetic field probe including a wiring substrate, a detector formed on a front end portion of the wiring substrate, and a transmission line having a conductor pattern and a ground pattern and connecting the detector and a base end portion of the wiring substrate. The detector includes a first line wiring pattern and a third line wiring pattern formed on a first surface of the wiring substrate and having a predetermined inclination with respect to an axial direction of the magnetic field probe, a second line wiring pattern and a fourth line wiring pattern formed on a second surface of the wiring substrate, which opposes the first surface, and having the predetermined inclination with respect to the axial direction of the magnetic field probe, a first via penetrating through the wiring substrate in a thickness direction and connecting a front end portion of the first wiring pattern and a front end portion of the second wiring pattern, a second via penetrating through the wiring substrate in the thickness direction and connecting a rear end portion of the second wiring pattern and a rear end portion of the third wiring pattern, and a third via penetrating through the wiring substrate in the thickness direction and connecting a front end portion of the third wiring pattern and a front end portion of the fourth wiring pattern. A rear end portion of the first wiring pattern is connected to the conductor pattern configuring the transmission line, and a rear end portion of the fourth wiring pattern is connected to the ground pattern configuring the transmission line.

With the magnetic field probe according to this aspect of the disclosure, the detector (loop part) having double loops can be formed by the first wiring pattern, the first via, the second wiring pattern, and the second via and the third wiring pattern, the third via, and the fourth wiring pattern. This can further enhance measurement sensitivity of the magnetic field probe in addition to the above-mentioned effects.

In the magnetic field probe according to this aspect of the disclosure, it is preferable that the wiring substrate be a multilayer substrate including a plurality of insulator layers, the ground patterns be formed on the first surface and the second surface, respectively, so as to form a pair, the conductor pattern be formed on a third surface defined by the plurality of insulator layers between the first surface and the second surface, and the rear end portion of the first wiring pattern and the conductor pattern be connected by a via extending in the thickness direction of the multilayer substrate.

In this case, the detector (loop part) and the base end portion of the multilayer substrate are connected by the transmission line having an adjusted characteristic impedance, for example. This can match impedances of the detector, the transmission line, and the base end portion, thereby suppressing generation of reflection waves on the detector and the base end portion.

Still another aspect of the present disclosure provides a magnetic field probe including a wiring substrate, a detector formed on a front end portion of the wiring substrate, and a transmission line having a conductor pattern and a ground pattern and connecting the detector and a base end portion of the wiring substrate. The detector includes a plurality of line wiring patterns formed on a first surface of the wiring substrate and having a predetermined inclination with respect to an axial direction of the magnetic field probe, a plurality of line wiring patterns formed on a second surface of the wiring substrate, which opposes the first surface, and having the predetermined inclination with respect to the axial direction of the magnetic field probe, and a plurality of vias penetrating through the wiring substrate in the thickness direction and connecting the plurality of wiring patterns formed on the first surface and the plurality of wiring patterns formed on the second surface in a spiral form. A starting end portion of the plurality of wiring patterns connected in the spiral form is connected to the conductor pattern configuring the transmission line, and a terminating end portion of the plurality of wiring patterns connected in the spiral form is connected to the ground pattern configuring the transmission line.

With the magnetic field probe according to this aspect of the disclosure, the detector (loop part) having multiple loops (for example, equal to or more than triple loops) can be formed. This can further enhance the measurement sensitivity of the magnetic field probe in addition to the above-mentioned effects.

Advantageous Effects of Disclosure

According to the present disclosure, an inclination of a loop part can be formed with high accuracy at the time of production, the number of loop turns can be increased while maintaining accuracy of the inclination of the loop part, and the accuracy of the inclination of the loop part can be maintained for a long period of time.

DETAILED DESCRIPTION

Figure 1:
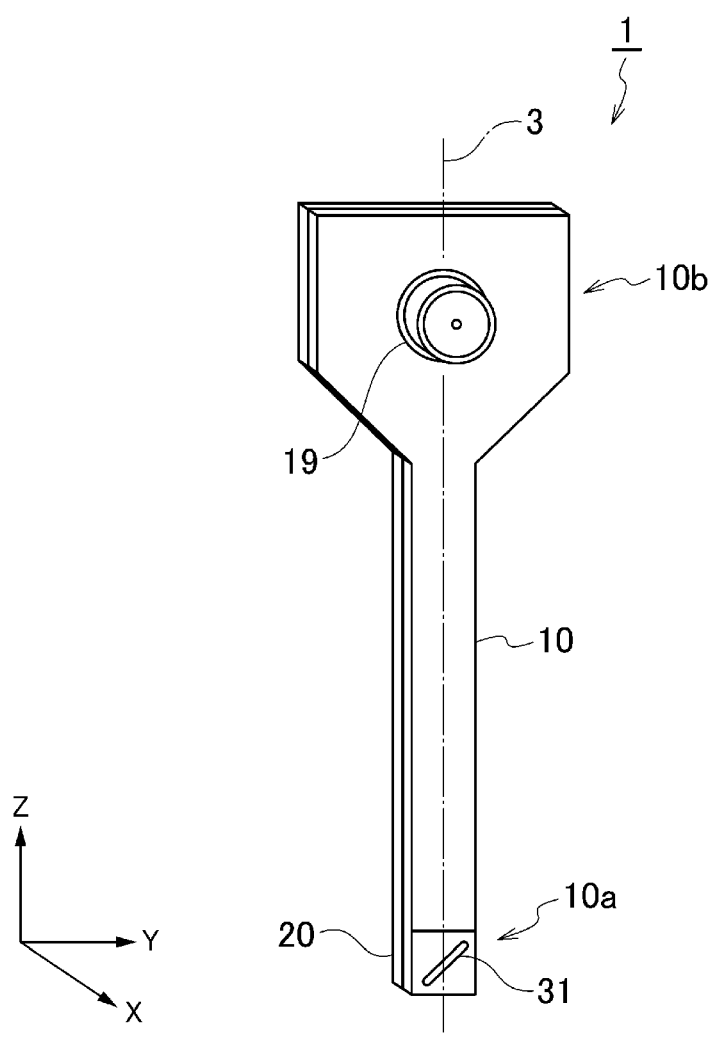
FIG. 1 is a perspective view illustrating the overall configuration of a magnetic field probe according to a first embodiment.

Hereinafter, preferable embodiments of the present disclosure will be described in detail with reference to the drawings. In the respective drawings, the same reference numerals denote the same constituent components and overlapped description thereof is omitted.

First Embodiment

Figure 2:
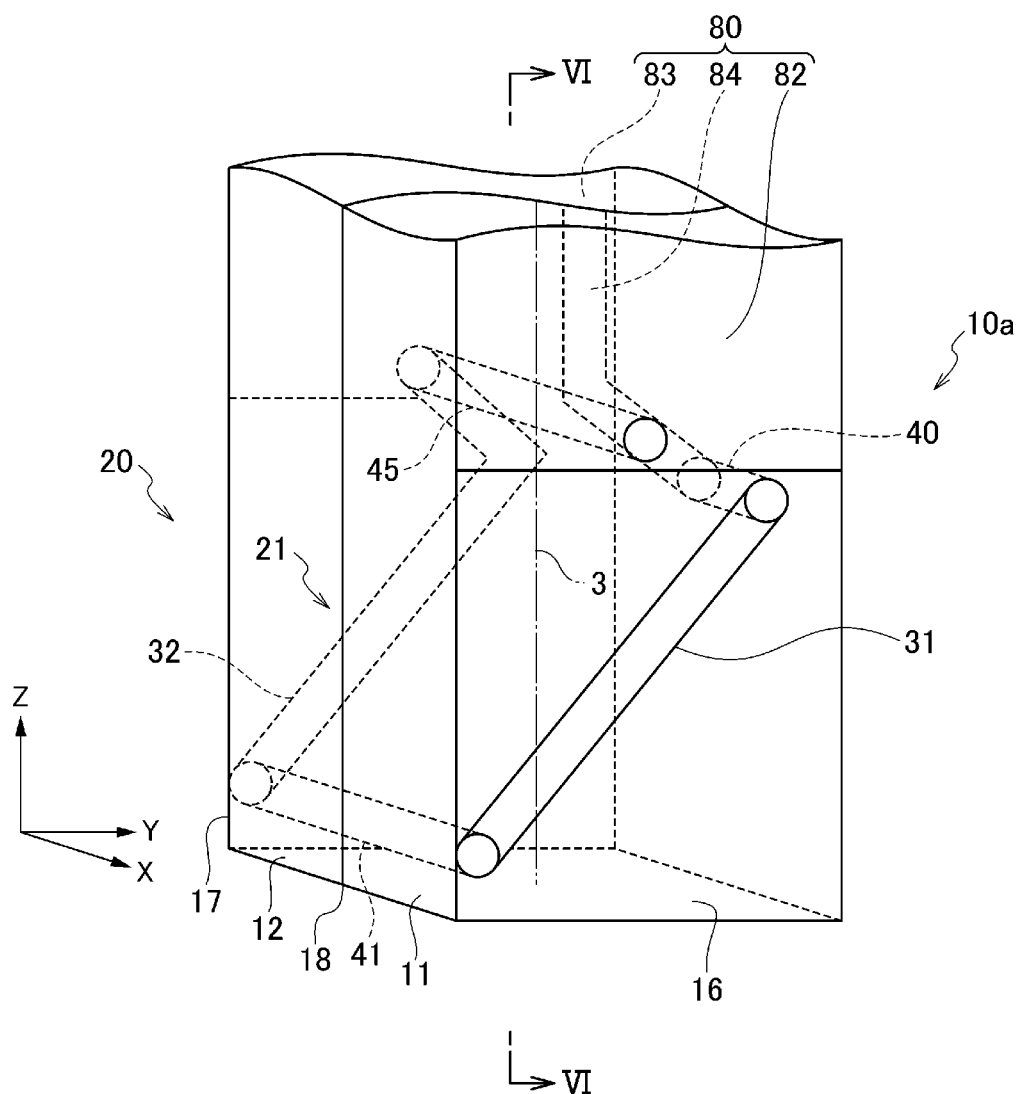
FIG. 2 is a perspective view illustrating the configuration of a detector of the magnetic field probe in the first embodiment.
Figure 3:
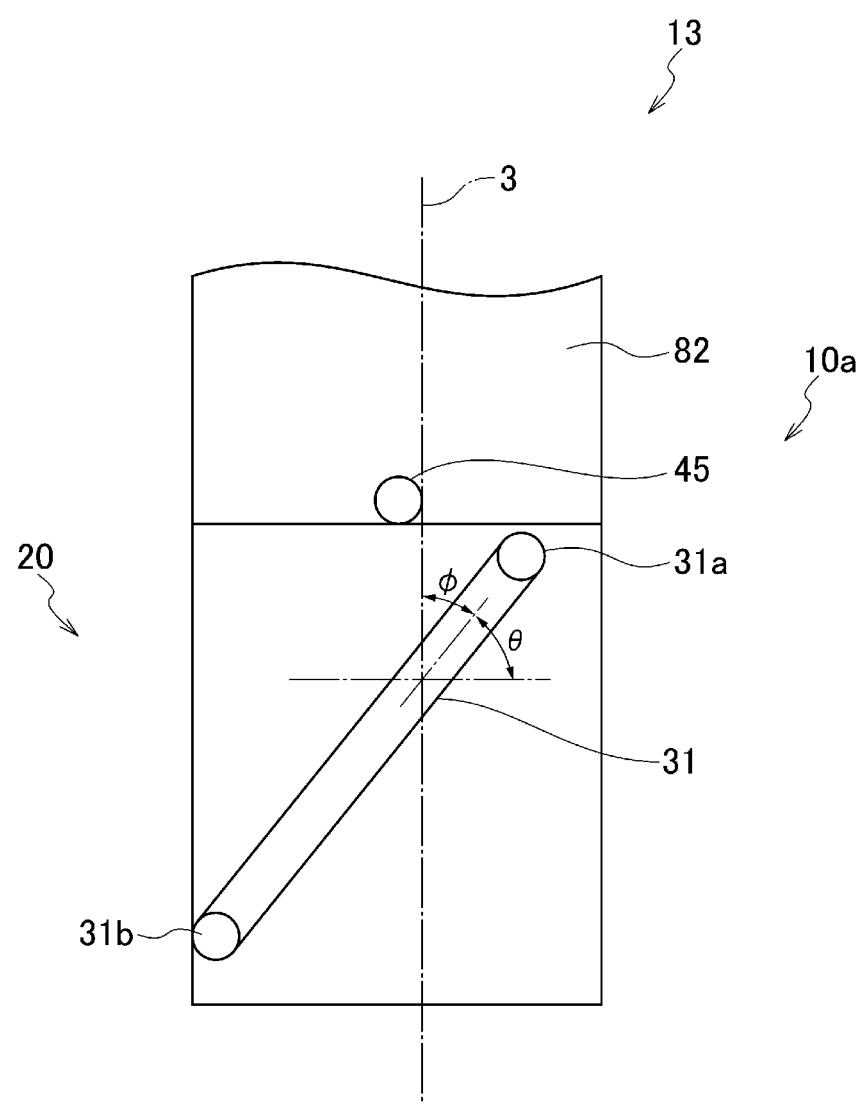
FIG. 3 is a view illustrating a wiring pattern of a first electrode layer configuring the detector of the magnetic field probe in the first embodiment.
Figure 4:
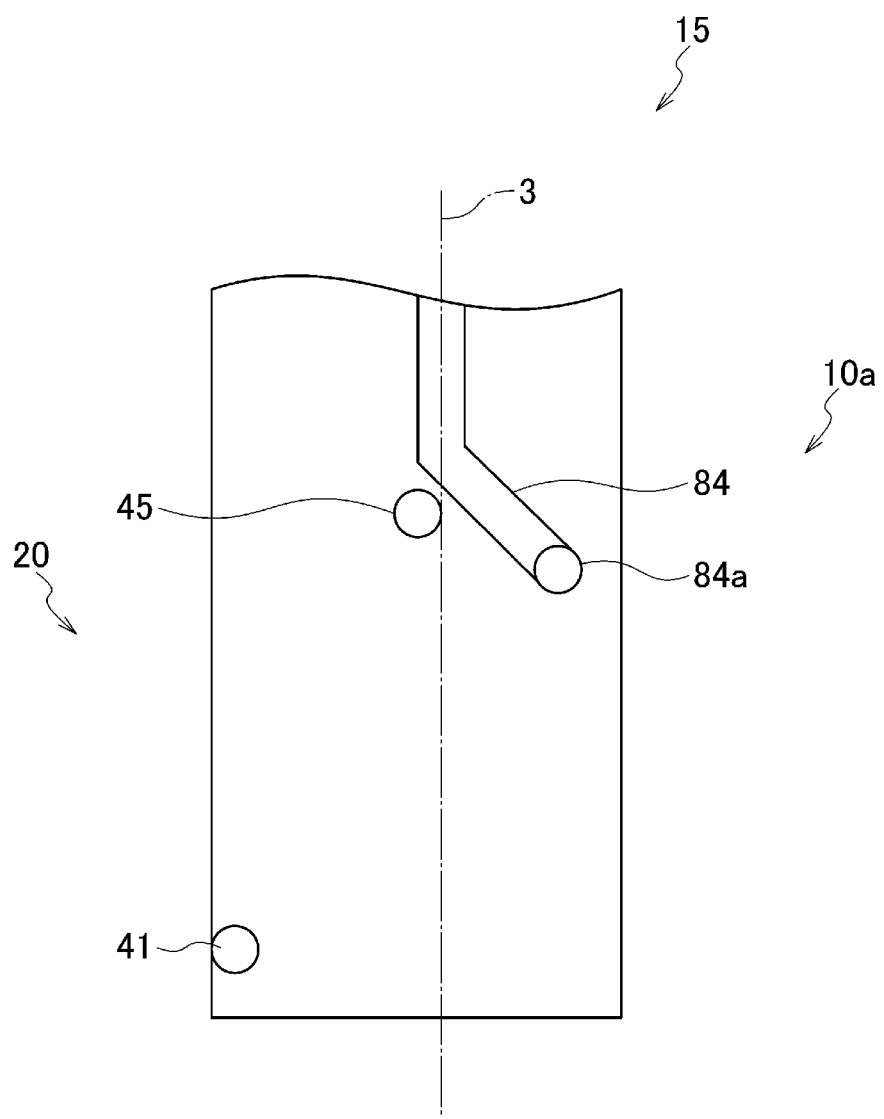
FIG. 4 is a view illustrating a wiring pattern of a second electrode layer configuring the detector of the magnetic field probe in the first embodiment.
Figure 5:
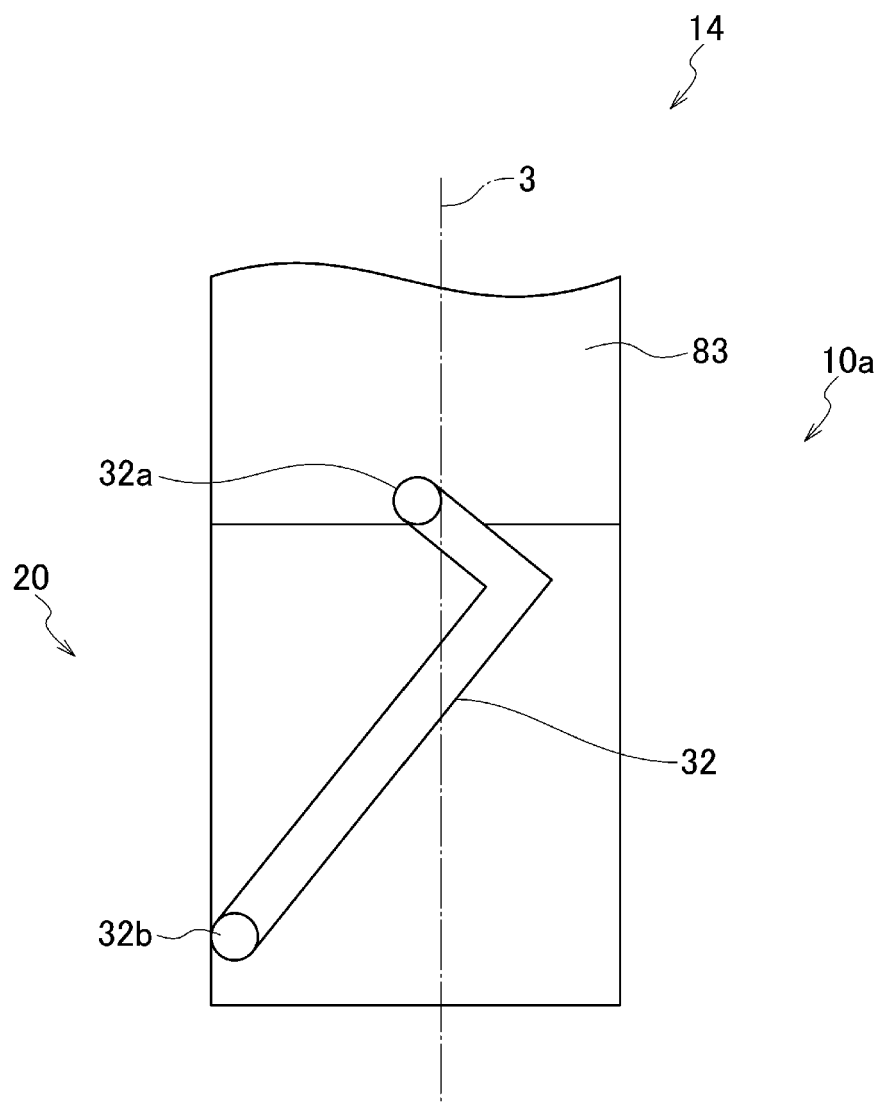
FIG. 5 is a view illustrating a wiring pattern of a third electrode layer configuring the detector of the magnetic field probe in the first embodiment.
Figure 6:
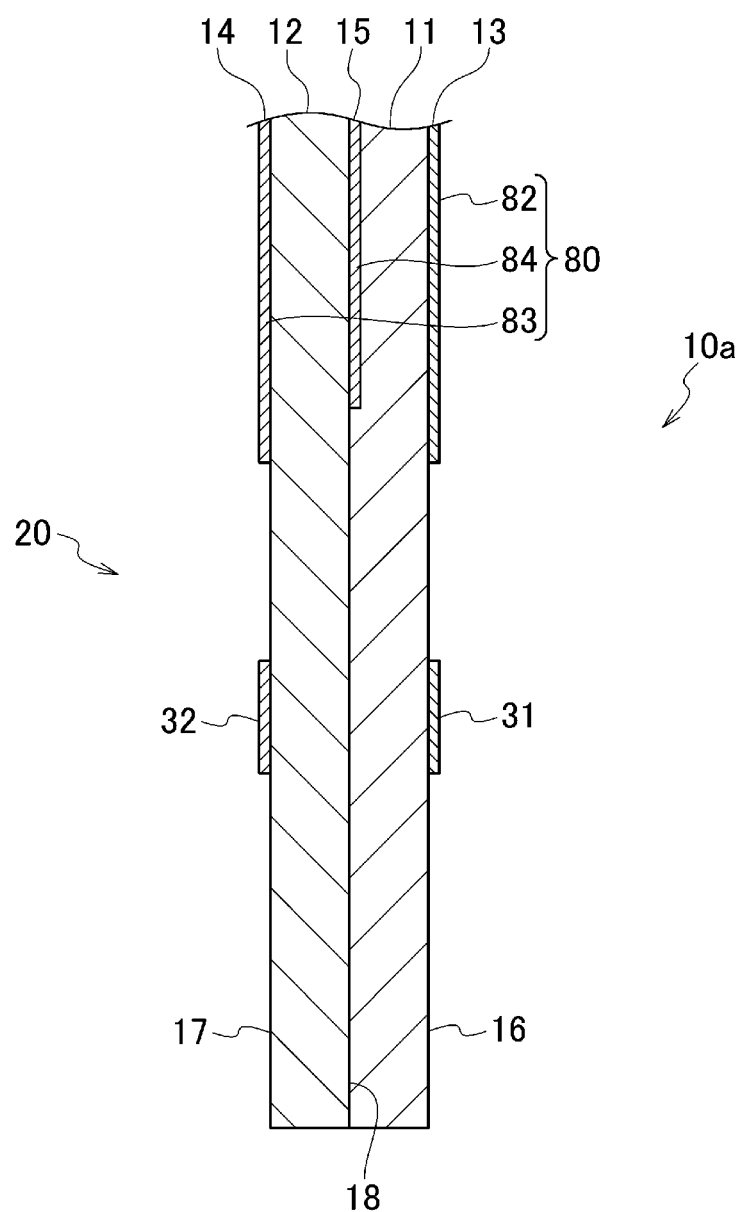
FIG. 6 is a cross-sectional view cut along a line VI-VI in FIG. 2.

First, the configuration of a magnetic field probe 1 according to a first embodiment will be described with reference to FIG. 1 to FIG. 6 in combination. FIG. 1 is a perspective view illustrating the overall configuration of the magnetic field probe 1. FIG. 2 is a perspective view illustrating the configuration of a detector 20 of the magnetic field probe 1. FIGS. 3 to 5 are views illustrating wiring patterns of a first electrode layer 13 to a third electrode layer 15 configuring the detector 20 of the magnetic field probe 1. FIG. 6 is a cross-sectional view cut along a line VI-VI in FIG. 2.

The magnetic field probe 1 includes a multilayer substrate 10, the detector 20, and a strip line (transmission line) 80. The detector 20 is formed on a front end portion 10a of the multilayer substrate 10. The strip line (transmission line) 80 includes a conductor pattern 84 and a pair of ground patterns 82 and 83 and connects the detector 20 and a base end portion 10b of the multilayer substrate 10.

The multilayer substrate 10 is formed into a substantially T shape when seen from the front side (when seen from the X-axis direction in FIG. 1) and a flat plate shape when seen from the side (when seen from the Y-axis direction in FIG. 1). For example, a glass epoxy substrate or the like, which is formed by laminating cloths made of glass fiber and impregnating it with epoxy resin, is preferably used as the multilayer substrate 10.

The multilayer substrate 10 is configured by laminating two insulator layers (dielectric layers), that is, a first insulator layer 11 and a second insulator layer 12 in the thickness direction (X-axis direction in FIG. 1). The detector 20 (details thereof will be described later) is formed on the front end portion 10a of the multilayer substrate 10. On the other hand, the base end portion 10b of the multilayer substrate 10 is formed to have a width dimension larger than that of the front end portion 10a. An SMA connector 19, for example, is attached to the base end portion 10b. The magnetic field probe 1 is connected to a measurement instrument such as a spectrum analyzer through a coaxial cable connected to the SMA connector 19. Then, the strength of a magnetic field in the vicinity of the detector is measured based on a detection signal (electromotive force) that is generated on the detector 20 of the magnetic field probe 1.

The multilayer substrate 10 is formed such that the front end portion 10a has a dimension of approximately several mm, for example, and the base end portion 10b has a dimension of approximately ten-odd mm, for example, in the width direction (Y-axis direction in FIG. 1). Further, the multilayer substrate 10 is formed so as to extend in the lengthwise direction (Z-axis direction in FIG. 1) and the length thereof is approximately several tens mm, for example. The center line thereof in the lengthwise direction is defined as an axial line 3. The axial line 3 makes contact with the scanning direction (X-Y plane) of the magnetic field probe 1 perpendicularly.

The first electrode layer 13 is formed on a first surface (hereinafter, also referred to as "front surface") 16 of the multilayer substrate 10. The first electrode layer 13 has a first wiring pattern 31 (details thereof will be described later) formed on the front end portion 10a of the multilayer substrate 10 (first surface 16) and a ground pattern 82 formed so as to cover a region of the multilayer substrate 10 (first surface 16) other than the front end portion 10a. On the other hand, a second electrode layer 14 is formed on a second surface (hereinafter, also referred to as "back surface") 17 of the multilayer substrate 10. The second electrode layer 14 includes a second wiring pattern 32 (details thereof will be described later) formed on the front end portion 10a of the multilayer substrate 10 (second surface 17) and the ground pattern 83 formed so as to cover a region of the multilayer substrate 10 (second surface 17) other than the front end portion 10a.

The third electrode layer 15 is formed on a third surface 18 defined between the first insulator layer 11 and the second insulator layer 12 configuring the multilayer substrate 10. The third electrode layer 15 includes the conductor pattern 84 substantially at the center of the third surface 18. The conductor pattern 84 extends along the direction of the axial line 3 of the magnetic field probe 1 in an elongated manner. Each of the ground patterns 82 and 83, the conductor pattern 84, the first wiring pattern 31, and the second wiring pattern 32 is formed by a conductive metal film, for example.

The pair of ground patterns 82 and 83 formed on both surfaces of the multilayer substrate 10 and the conductor pattern (strip conductor) 84 as mentioned above configure the strip line (transmission line) 80. The strip line 80 connects the detector 20 and the SMA connector 19. The characteristic impedance of the strip line 80 is adjusted to 50 Ω, for example.

The detector 20 is arranged on the front end portion 10a of the multilayer substrate 10 and includes a zeroth via 40, the first wiring pattern 31, a first penetrating via 41, the second wiring pattern 32, and a fifth penetrating via 45.

The first wiring pattern 31 is a line wiring pattern and is formed on the first surface 16 of the multilayer substrate 10 as described above. The first wiring pattern 31 is formed to have a predetermined inclination with respect to the axial line 3 of the magnetic field probe 1. When an inclination angle of the first wiring pattern 31 with respect to the axial line 3 of the magnetic field probe 1 is assumed to be $\phi$, the inclination angle $\phi$ is obtained by the following equation (1).

$$\phi = \tan^{-1}(1/\sqrt{2}) = 35.3° \tag{1}$$

When an angle with respect to the scanning direction (X-Y plane) of the magnetic field probe 1 is assumed to be $\theta$, the angle $\theta$ is obtained by the following equation (2).

$$\theta = 90 - 35.3 = 54.7° \tag{2}$$

The second wiring pattern 32 is also a line wiring pattern and is formed on the second surface 17 of the multilayer substrate 10, which is parallel with the first surface 16. The second wiring pattern 32 is formed to have the predetermined inclination $\phi$ with respect to the axial line 3 of the magnetic field probe 1 as in the first wiring pattern 31. Further, the second wiring pattern 32 is arranged at a position that substantially overlaps with the first wiring pattern 31 when seen from the direction (X-axis direction in FIG. 1) perpendicular to the second surface 17 of the multilayer substrate 10. The second wiring pattern 32 is formed to have a shape in which a rear end portion thereof is bent at a substantially right angle so as to prevent the fifth penetrating via 45, which will be described later, from being interfered with by the conductor pattern 84.

A rear end portion 31a of the first wiring pattern 31 is connected to a front end portion 84a of the conductor pattern 84 configuring the strip line 80 by the zeroth via 40 extending in the thickness direction of the multilayer substrate 10. A front end portion 31b of the first wiring pattern 31 is connected to a front end portion 32b of the second wiring pattern 32 by the first penetrating via 41 penetrating through the multilayer substrate 10 in the thickness direction. The vias including the zeroth via 40 and the first penetrating via 41 have conductive metal films that are formed on the internal wall surfaces thereof by plating processing or the like, for example.

A rear end portion 32a of the second wiring pattern 32 is connected to the ground pattern 83 configuring the strip line 80. The rear end portion 32a (that is, ground pattern 83) of the second wiring pattern 32 is connected to the opposing ground pattern 82 by the fifth penetrating via 45 penetrating through the multilayer substrate 10 in the thickness direction.

As described above, the zeroth via 40, the first wiring pattern 31, the first penetrating via 41, and the second wiring pattern 32 that are formed on the multilayer substrate 10 form a loop part 21 having the predetermined inclination $\phi$ (inclination $\phi$=35.3° in the embodiment) with respect to the axial line 3 of the magnetic field probe 1.

Next, the operations of the magnetic field probe 1 having the above-mentioned configuration will be described. For example, when the strength of the magnetic field of the circuit substrate or the like is measured, first, the magnetic field probe 1 is arranged in a state where the front end portion 10a (detector 20) is brought close to the surface of a measurement target such as the circuit substrate. That is to say, the magnetic field probe 1 is arranged such that the loop part 21 having the predetermined inclination $\phi$ (inclination $\phi$=35.3° in the embodiment) is brought close to the surface of the measurement target. This generates electromotive force on the loop part 21 in accordance with the magnetic field (change in the magnetic flux) passing through the inner side of the loop part 21 in the detector 20. Therefore, a magnetic field that is generated on the surface of the measurement target can be measured by measuring the electromotive force with the measurement instrument such as the spectrum analyzer connected to the SMA connector 19.

Figure 7:
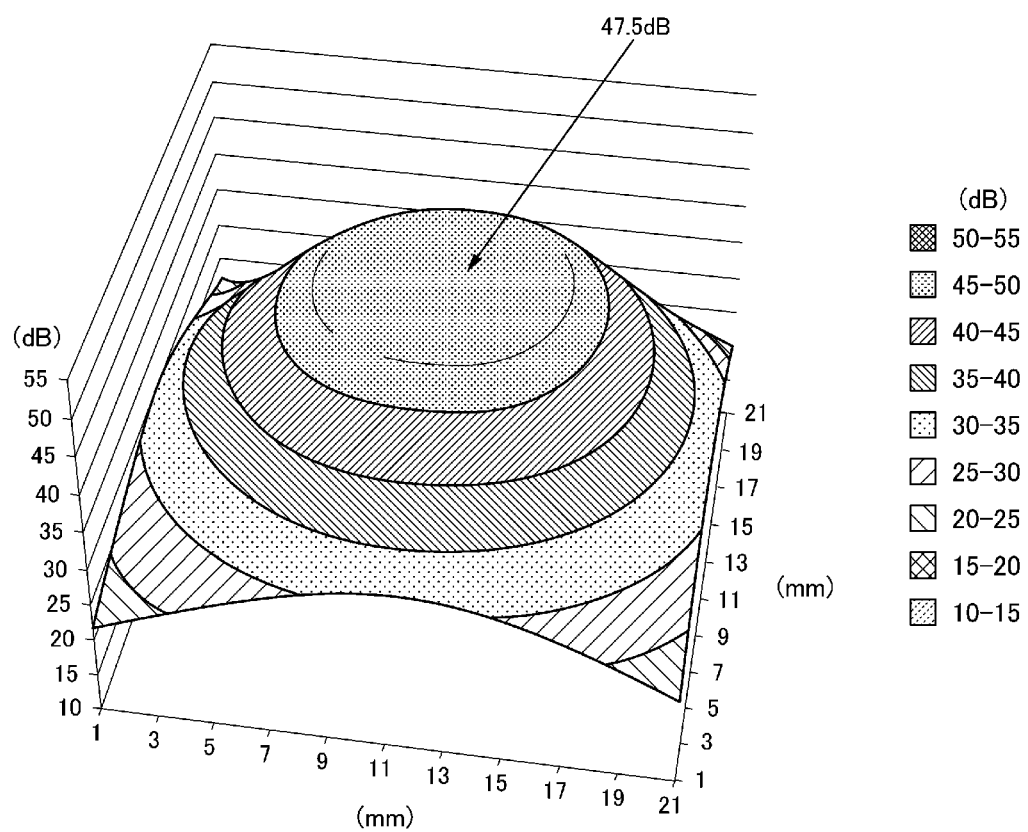
FIG. 7 is a view illustrating an example of a result of measurement of a magnetic field by the magnetic field probe in the first embodiment.

Subsequently, the magnetic fields are measured by rotating the magnetic field probe 1 by 120° and 240° about the axial line 3 (perpendicular direction) of the magnetic field probe 1 as the rotating axis. Then, a square-root of the sum of the squares of the strengths of the magnetic fields at 0°, 120°, and 240° with respect to the axial line 3 (perpendicular direction) is calculated so as to obtain a synthetic absolute value of the strength of the magnetic field obtained in the three axial (X-axis, Y-axis, and Z-axis) directions orthogonal to one another. FIG. 7 illustrates an example of a measurement result obtained by combining the magnetic fields measured every 120° by using the magnetic field probe 1. A numerical value as indicated in an upper right portion in FIG. 7 corresponds to the strength (in this case, 47.5 dB) of the magnetic field at the center portion.

As described above, the loop part 21 is formed by the zeroth via 40, the first wiring pattern 31, the second wiring pattern 32, and the first penetrating via 41 connecting the front end portion 31b of the first wiring pattern 31 and the front end portion 32b of the second wiring pattern 32 that are formed on the multilayer substrate 10 in the embodiment. Therefore, the inclination of the loop part 21 can be formed with high accuracy at the time of production. In addition, the loop part 21 can be made difficult to be deformed and the accuracy of the inclination of the loop part 21 can be maintained for a long period of time. The number of loop turns can be also increased while maintaining the accuracy of the inclination of the loop part 21 by increasing the number of wiring patterns and vias that are to be formed.

Further, in this embodiment, the strip line 80 of which characteristic impedance is adjusted to 50 $\Omega$, for example, connects the loop part 21 (detector 20) and the SMA connector 19 attached to the base end portion 10a of the multilayer substrate 10. This can match the impedances of the detector 20, the strip line 80, and the SMA connector 19, thereby suppressing generation of reflection waves reflected by the SMA connector 19 and the detector 20.

Second Embodiment

Figure 8:
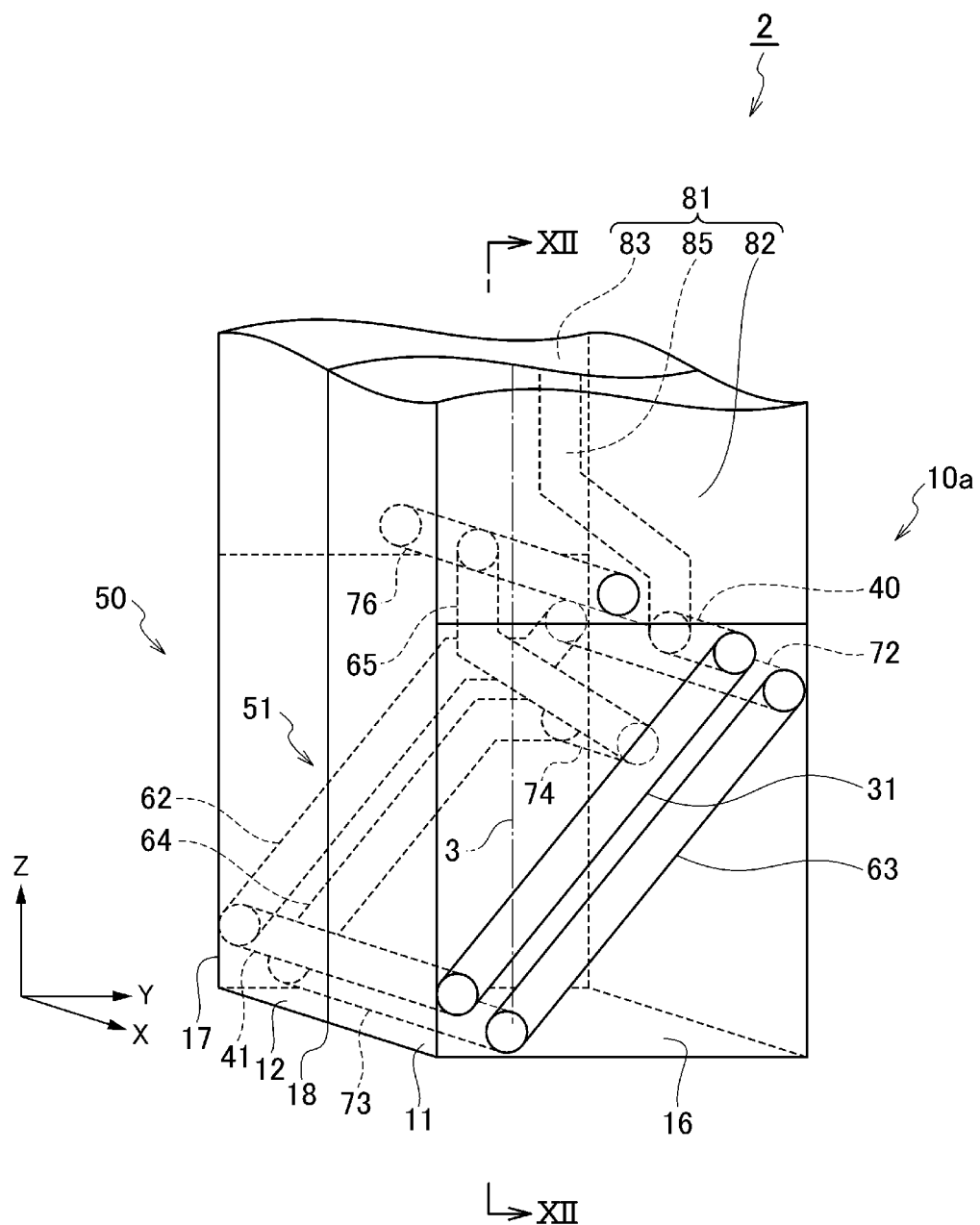
FIG. 8 is a perspective view illustrating the configuration of a detector of a magnetic field probe according to a second embodiment.
Figure 9:
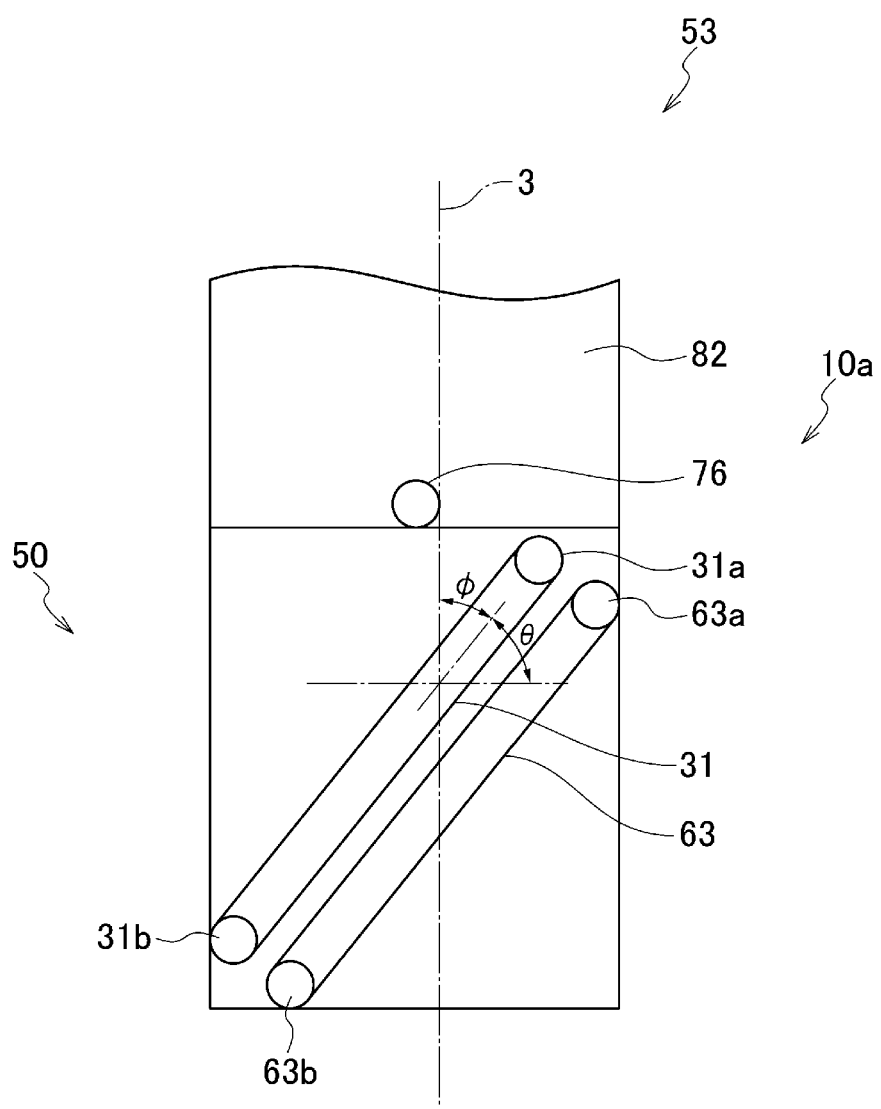
FIG. 9 is a view illustrating a wiring pattern of a first electrode layer configuring the detector of the magnetic field probe in the second embodiment.
Figure 10:
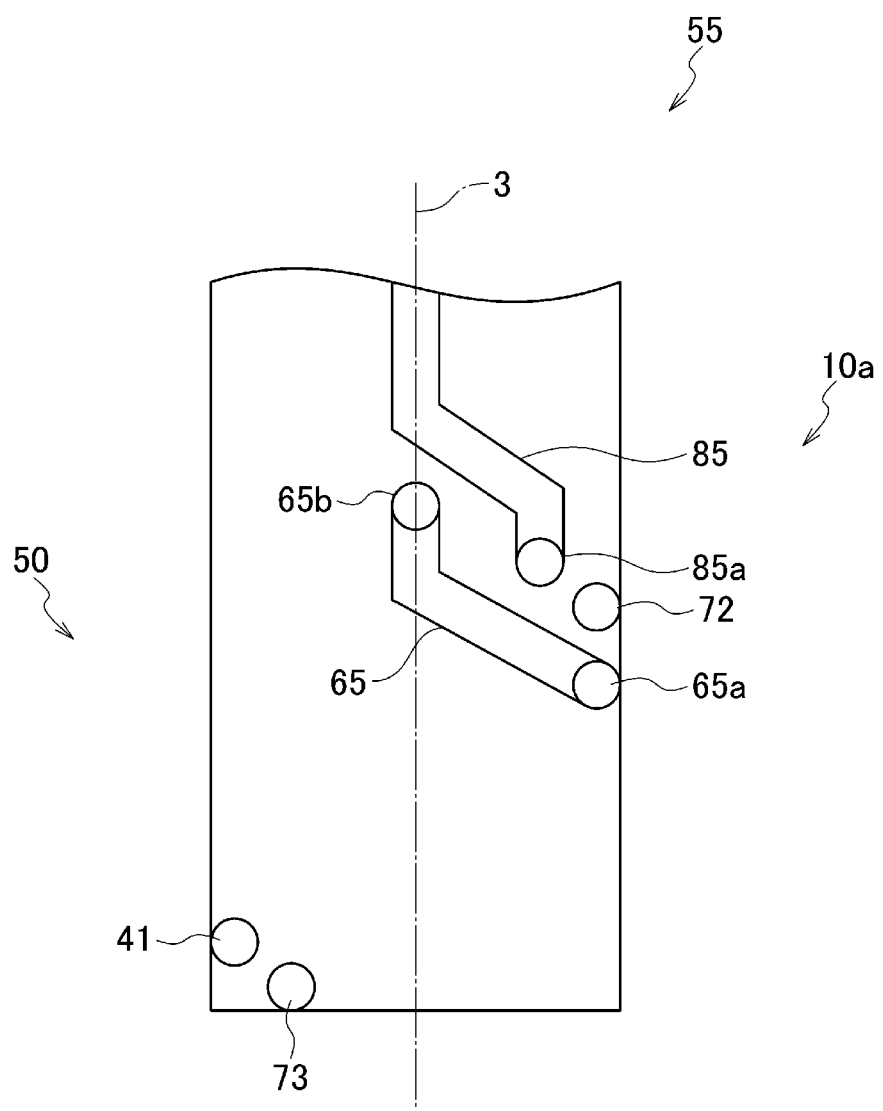
FIG. 10 is a view illustrating a wiring pattern of a second electrode layer configuring the detector of the magnetic field probe in the second embodiment.
Figure 11:
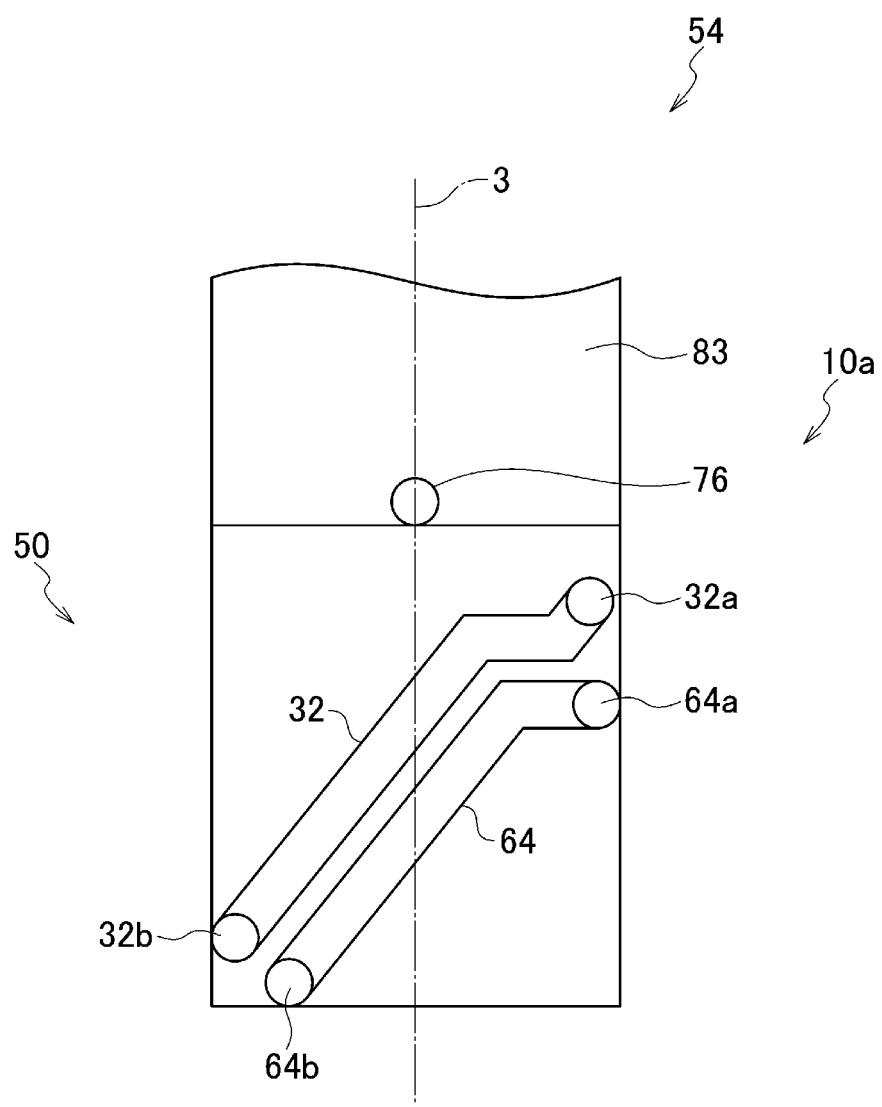
FIG. 11 is a view illustrating a wiring pattern of a third electrode layer configuring the detector of the magnetic field probe in the second embodiment.
Figure 12:
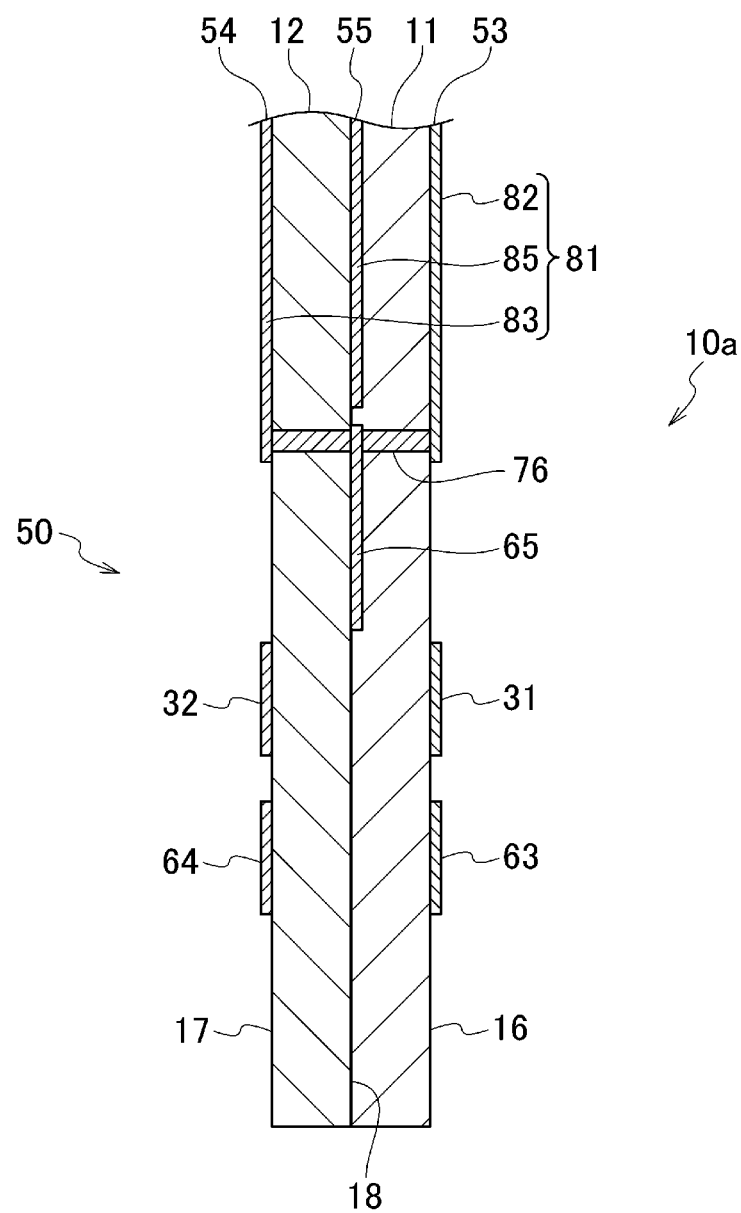
FIG. 12 is a cross-sectional view cut along a line XII-XII in FIG. 8.

In order to increase the sensitivity of the magnetic field probe, it is effective that the number of loop turns is increased. Subsequently, the configuration of an magnetic field probe 2 according to a second embodiment, which has double loops, will be described with reference to FIGS. 8 to 12 in combination. FIG. 8 is a perspective view illustrating the configuration of a detector 50 of the magnetic field probe 2. FIGS. 9 to 11 are views illustrating wiring patterns of a first electrode layer 53 to a third electrode layer 55 configuring the detector 50 of the magnetic field probe 2. FIG. 12 is a cross-sectional view cut along a line XII-XII in FIG. 8. The same reference numerals as those in the first embodiment denote the same or equivalent constituent components in FIGS. 8 to 12.

The magnetic field probe 2 is different from the above-mentioned magnetic field probe 1 in that it includes the detector 50 having double loops instead of the detector 20 having a single loop. Other configurations of the magnetic field probe 2 are the same as or equivalent to those of the above-mentioned magnetic field probe 1 and illustration thereof in the drawings and detail description thereof are omitted.

The detector 50 is arranged on the front end portion 10a of the multilayer substrate 10 and includes the zeroth via 40, the first wiring pattern 31, the first penetrating via 41, a second wiring pattern 62, a second penetrating via 72, a third wiring pattern 63, a third penetrating via 73, a fourth wiring pattern 64, a fourth via 74, a fifth wiring pattern 65, and a sixth penetrating via 76.

The first wiring pattern 31 and the third wiring pattern 63 are line wiring patterns parallel with each other and are formed on the first surface 16 of the multilayer substrate 10. The first wiring pattern 31 and the third wiring pattern 63 are formed to have the predetermined inclination p (inclination $\phi$=35.3° in this embodiment) with respect to the axial line 3 of the magnetic field probe 2.

On the other hand, the second wiring pattern 62 and the fourth wiring pattern 64 are also line wiring patterns parallel with each other and are formed on the second surface 17 of the multilayer substrate 10. Further, the second wiring pattern 62 and the fourth wiring pattern 64 are formed to have the predetermined inclination $\phi$ with respect to the axial line 3 of the magnetic field probe 2 in the same manner as the first wiring pattern 31 and the third wiring pattern 63. The second wiring pattern 62 and the fourth wiring pattern 64 are arranged at positions that substantially overlap with the first wiring pattern 31 and the third wiring pattern 63, respectively, when seen from the direction (X-axis direction in FIG. 8) perpendicular to the second surface 17 of the multilayer substrate 10.

The second wiring pattern 62 and the fourth wiring pattern 64 are formed to have shapes in which rear end portions thereof are bent in order to connect the plurality of wiring patterns in a spiral form while avoiding interference between them.

The rear end portion 31a of the first wiring pattern 31 is connected to a front end portion 85a of the conductor pattern 85 configuring a strip line 81 by the zeroth via 40 extending in the thickness direction of the multilayer substrate 10 (first insulator layer 11). The front end portion 31b of the first wiring pattern 31 is connected to a front end portion 62b of the second wiring pattern 62 by the first penetrating via 41 penetrating through the multilayer substrate 10 in the thickness direction.

On the other hand, a rear end portion 62a of the second wiring pattern 62 is connected to a rear end portion 63a of the third wiring pattern 63 by the second penetrating via 72 penetrating through the multilayer substrate 10 in the thickness direction. A front end portion 63b of the third wiring pattern 63 is connected to a front end portion 64b of the fourth wiring pattern 64 by the third penetrating via 73 penetrating through the multilayer substrate 10 in the thickness direction.

A rear end portion 64a of the fourth wiring pattern is connected to the ground pattern 83 and the ground pattern 82 configuring the strip line 81 through the fourth via 74 extending in the thickness direction of the multilayer substrate 10 (second insulator layer 12), the fifth wiring pattern 65 formed on the third surface 18 (third electrode layer 55), and the sixth penetrating via 76 penetrating through the multilayer substrate 10 in the thickness direction.

As described above, the zeroth via 40, the first wiring pattern 31, the first penetrating via 41, the second wiring pattern 62, the second penetrating via 72, the third wiring pattern 63, the third penetrating via 73, the fourth wiring pattern 64, the fourth via 74, and the fifth wiring pattern 65 that are formed on the multilayer substrate 10 form a loop part 51 with double loops having the predetermined inclination $\phi$ (inclination $\phi=35.3°$ in this embodiment) with respect to the axial line 3 of the magnetic field probe 2.

Next, the operations of the magnetic field probe 2 having the above-mentioned configuration will be described. Also in the magnetic field probe 2 in this embodiment, the magnetic fields are measured while rotating the magnetic field probe 2 by 120° each time about the axial line 3 (perpendicular direction) of the magnetic field probe 2 as the rotating axis in the same manner as the magnetic field probe 1 as described above. Then, a square-root of the sum of the squares of the strengths of the magnetic fields at 0°, 120°, and 240° with respect to the axial line 3 (perpendicular direction) is calculated so as to obtain a synthetic absolute value of the strength of the magnetic field obtained in the three axial (X-axis, Y-axis, and Z-axis) directions orthogonal to one another.

Figure 13:
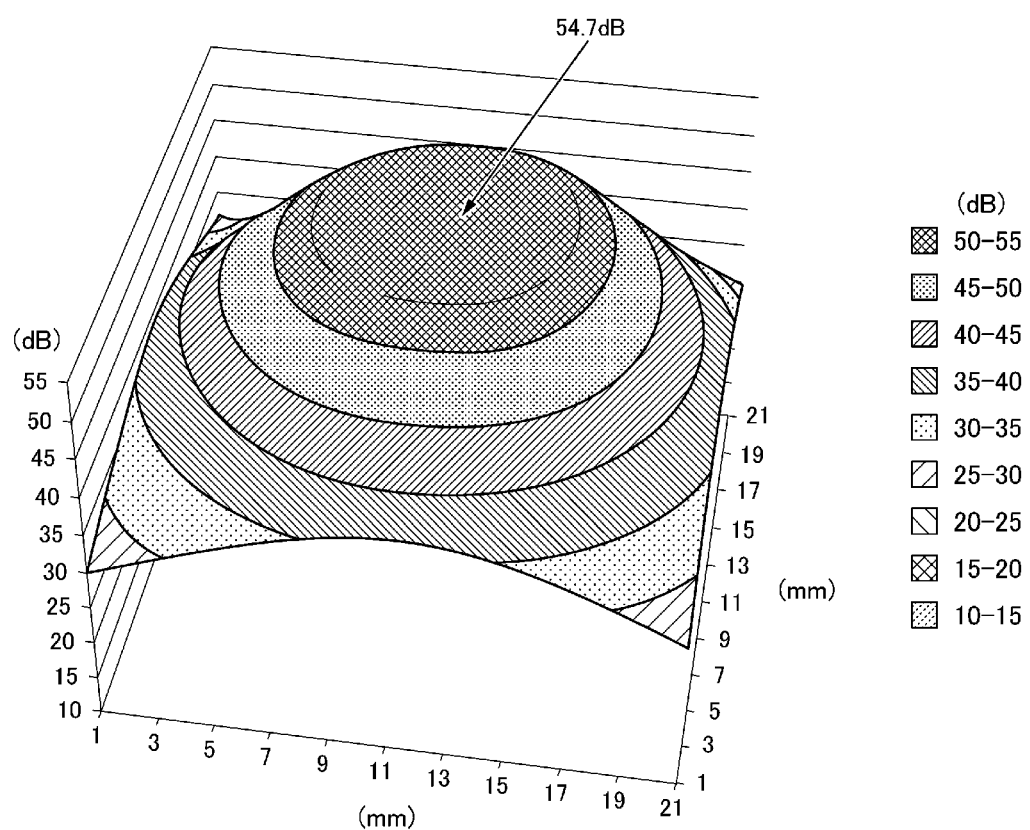
FIG. 13 is a view illustrating an example of a result of measurement of a magnetic field by the magnetic field probe in the second embodiment.

FIG. 13 illustrates an example of a measurement result obtained by measuring the magnetic fields in the three axial directions orthogonal to one another while rotating the magnetic field probe 2 by 120° each time using the same measurement target as that in the above-mentioned first embodiment and combining them. A numerical value as indicated in an upper right portion in FIG. 13 corresponds to the strength (in this case, 54.7 dB) of the magnetic field at the center portion. The strength of the magnetic field at the center portion is higher than that in the first embodiment. Based on this, it is found that the measurement sensitivity can be improved by increasing the number of loop turns according to the embodiment.

As described above, in this embodiment, the detector 50 has double loops so as to further enhance the measurement sensitivity of the magnetic field probe 2 in addition to the effects obtained in the above-mentioned first embodiment.

Although the embodiments of the disclosure have been described above, the disclosure is not limited to the above-mentioned embodiments and various modifications can be made. For example, although the number of loop turns of the detector 20 (50) is single (first embodiment) or double (second embodiment) in the above-mentioned embodiments, the number of loop turns may be equal to or more than triple.

That is to say, instead of connection of the ground patterns 82 and 83 to the rear end portion 64a of the fourth wiring pattern 64 in the magnetic field probe 2 in the above-mentioned second embodiment, a penetrating via and a plurality of wiring patterns may be connected in the spiral form and a terminating end portion of the plurality of wiring patterns connected in the spiral form may be connected to the ground patterns 82 and 83 configuring the strip line 81. With this, the number of loop turns can be made equal to or more than triple so as to further enhance the measurement sensitivity of the magnetic field probe.

Although the multilayer substrate including two insulator layers is used in the above-mentioned embodiments, the number of insulator layers is not limited to two and may be equal to or more than three.

Although the strip line is used as the transmission line in the above-mentioned embodiments, a micro strip line may be used. In this case, a single layered double-sided substrate (wiring substrate) can be also used instead of the multilayer substrate.

The invention claimed is:

1. A magnetic field probe comprising:
    a wiring substrate;
    a detector formed on a front end portion of the wiring substrate; and
    a transmission line having a conductor pattern and a ground pattern and connecting the detector and a base end portion of the wiring substrate,
    wherein the detector includes:
        a first line wiring pattern formed on a first surface of the wiring substrate and having a predetermined inclination with respect to an axial direction of the magnetic field probe;
        a second line wiring pattern formed on a second surface of the wiring substrate, which opposes the first surface, and having the predetermined inclination with respect to the axial direction of the magnetic field probe; and
        a first via penetrating through the wiring substrate in a thickness direction and connecting a front end portion of the first line wiring pattern and a front end portion of the second line wiring pattern,
    a rear end portion of the first line wiring pattern being connected to the conductor pattern configuring the transmission line, and
    a rear end portion of the second line wiring pattern being connected to the ground pattern configuring the transmission line.

2. The magnetic field probe according to claim 1,
    wherein the wiring substrate is a multilayer substrate including a plurality of insulator layers,
    the ground pattern is formed on the first surface and the second surface, respectively, so as to form a pair of ground patterns,
    the conductor pattern is formed on a third surface defined by the plurality of insulator layers between the first surface and the second surface, and the rear end portion of the first line wiring pattern and the conductor pattern are connected by a via extending in the thickness direction of the multilayer substrate.

3. A magnetic field probe comprising:
a wiring substrate;
a detector formed on a front end portion of the wiring substrate; and
a transmission line having a conductor pattern and a ground pattern and connecting the detector and a base end portion of the wiring substrate,
wherein the detector includes:
   a first line wiring pattern and a third line wiring pattern formed on a first surface of the wiring substrate and having a predetermined inclination with respect to an axial direction of the magnetic field probe;
   a second line wiring pattern and a fourth line wiring pattern formed on a second surface of the wiring substrate, which opposes the first surface, and having the predetermined inclination with respect to the axial direction of the magnetic field probe;
   a first via penetrating through the wiring substrate in a thickness direction and connecting a front end portion of the first line wiring pattern and a front end portion of the second line wiring pattern;
   a second via penetrating through the wiring substrate in the thickness direction and connecting a rear end portion of the second line wiring pattern and a rear end portion of the third line wiring pattern; and
   a third via penetrating through the wiring substrate in the thickness direction and connecting a front end portion of the third line wiring pattern and a front end portion of the fourth line wiring pattern,
a rear end portion of the first line wiring pattern being connected to the conductor pattern configuring the transmission line, and
a rear end portion of the fourth line wiring pattern being connected to the ground pattern configuring the transmission line.

4. The magnetic field probe according to claim 3,
wherein the wiring substrate is a multilayer substrate including a plurality of insulator layers,
the ground pattern is formed on the first surface and the second surface, respectively, so as to form a pair of ground patterns,
the conductor pattern is formed on a third surface defined by the plurality of insulator layers between the first surface and the second surface, and
the rear end portion of the first line wiring pattern and the conductor pattern are connected by a via extending in the thickness direction of the multilayer substrate.

5. A magnetic field probe comprising:
a wiring substrate;
a detector formed on a front end portion of the wiring substrate; and
a transmission line having a conductor pattern and a ground pattern and connecting the detector and a base end portion of the wiring substrate,
wherein the detector includes:
   a plurality of line wiring patterns formed on a first surface of the wiring substrate and having a predetermined inclination with respect to an axial direction of the magnetic field probe;
   a plurality of line wiring patterns formed on a second surface of the wiring substrate, which opposes the first surface, and having the predetermined inclination with respect to the axial direction of the magnetic field probe; and
   a plurality of vias penetrating through the wiring substrate in the thickness direction and connecting the plurality of line wiring patterns formed on the first surface and the plurality of line wiring patterns formed on the second surface in a spiral form,
a starting end portion of the plurality of line wiring patterns connected in the spiral form is connected to the conductor pattern configuring the transmission line, and
a terminating end portion of the plurality of line wiring patterns connected in the spiral form is connected to the ground pattern configuring the transmission line.

* * * * *